United States Patent
Tanaka et al.

(10) Patent No.: US 11,670,696 B2
(45) Date of Patent: Jun. 6, 2023

(54) SEMICONDUCTOR DEVICE AND PRODUCTION METHOD THEREFOR

(71) Applicant: TOYODA GOSEI CO., LTD., Kiyosu (JP)

(72) Inventors: Nariaki Tanaka, Kiyosu (JP); Go Nishio, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 0 days.

(21) Appl. No.: 17/334,380

(22) Filed: May 28, 2021

(65) Prior Publication Data

US 2021/0384308 A1 Dec. 9, 2021

(30) Foreign Application Priority Data

Jun. 4, 2020 (JP) ............... JP2020-097384

(51) Int. Cl.
*H01L 29/423* (2006.01)
*H01L 29/66* (2006.01)

(52) U.S. Cl.
CPC .. *H01L 29/42364* (2013.01); *H01L 29/42384* (2013.01); *H01L 29/66477* (2013.01); *H01L 2029/42388* (2013.01)

(58) Field of Classification Search
CPC ......... H01L 29/42364; H01L 29/42384; H01L 29/66477; H01L 2029/42388; H01L 29/41766; H01L 29/66727; H01L 29/66734; H01L 29/0696; H01L 29/42368; H01L 29/66522; H01L 29/2003; H01L 29/7813; H01L 29/66613–66628
See application file for complete search history.

(56) References Cited

U.S. PATENT DOCUMENTS

| | | | |
|---|---|---|---|
| 10,236,373 B2 | 3/2019 | Kurosaki et al. | |
| 2013/0126904 A1* | 5/2013 | Masuda | H01L 29/7813 257/77 |
| 2019/0140093 A1* | 5/2019 | Okumura | H01L 29/0865 |
| 2019/0348524 A1* | 11/2019 | Ebiike | H01L 29/66712 |

FOREIGN PATENT DOCUMENTS

| | | |
|---|---|---|
| JP | 2008-198787 A | 8/2008 |
| WO | WO 2008/099852 A1 | 8/2008 |

* cited by examiner

*Primary Examiner* — Shahed Ahmed
(74) *Attorney, Agent, or Firm* — McGinn I.P. Law Group, PLLC.

(57) ABSTRACT

The present invention provides a semiconductor device relaxing the electric field concentration in a gate insulating film just below a gate electrode, and a production method therefor. The semiconductor device has a third semiconductor layer, a gate insulating film, a gate electrode, and a passivation film. The gate insulating film has a gate electrode contact region being in contact with the gate electrode, and a gate electrode non-contact region not being in contact with the gate electrode. The passivation film has a dielectric constant higher than the dielectric constant of the gate insulating film. A thickness of the gate electrode contact region and a thickness of the gate electrode non-contact region satisfy the following equation $0.8 \leq t2/t1 < 1$.

6 Claims, 12 Drawing Sheets

SEMICONDUCTOR DEVICE AND PRODUCTION METHOD THEREFOR

BACKGROUND OF THE INVENTION

Field of the Invention

The present invention relates to a semiconductor device, and a production method therefor.

Background Art

Group III nitride semiconductor represented by GaN has a high band gap, high dielectric breakdown field, high electron mobility, and high melting point. Therefore, Group III nitride semiconductor is expected as a material replacing GaAs based semiconductor for a high-output, high-frequency, and high-temperature semiconductor device. Because of such advantages, a. semiconductor device using Group III nitride semiconductor has been researched and developed.

As an example of such a semiconductor device, a vertical MIS-type semiconductor device is known. In this MIS-type semiconductor device, an insulating film is formed in contact with semiconductor in a channel formation region, and a gate electrode is formed in contact with the insulating film. For example, Patent Document 1 discloses a semiconductor device having a GaN based semiconductor, a gate insulating film 7, and a gate electrode 8 (paragraph of Patent Document 1). As a gate insulating film 7, oxide such as $SiO_2$, $Ga_2O_3$, MgO, $ZrO_2$, $Al_2O_3$, $TiO_2$, and $Gd_2O_3$ may be used (paragraph [0018] of Patent Document 1). An insulating film 11 different from a gate insulating film 7 is disposed between a gate electrode 8 and a source electrode 9 (FIG. 1 of Patent Document 1).

Patent Document 1: Japanese Patent Application Laid-Open (kokai) No. 2008-198787

As in Patent Document 1, the MIS-type semiconductor device has a structure in which a gate insulating film having a constant and uniform thickness projects outside of the gate electrode. In this structure, a high electric field is generated at an insulating film lust below the end part of the gate electrode 8, and current rapidly flows between the gate electrode 8 and the source electrode 9, leading to a dielectric breakdown. To prevent dielectric breakdown between the gate electrode and the source electrode, electric field concentration is preferably relaxed in the gate insulating film just below the end part of the gate electrode. Not only in Patent Document 1 but generally, a strong electric field is easily formed locally in a periphery of the end part of the gate electrode.

An object of the present invention is to provide a semiconductor device relaxing electric field concentration in a gate insulating film lust below an end part of a gate electrode, and a production method therefor.

In a first aspect of the present invention, there is provided a semiconductor device having a semiconductor layer, a gate insulating film on the semiconductor layer, a gate electrode on the gate insulating film, and a passivation film on the gate electrode. The gate insulating film has a gate electrode contact region being in contact with the gate electrode, and a gate electrode non-contact region not being in contact with the gate electrode. The passivation film has a dielectric constant higher than the dielectric constant of the gate insulating film, and a thickness of the gate electrode contact region and a thickness of the gate electrode non-contact region satisfy the following equation.

$$0.8 \leq t2/t1 < 1$$

t1: Thickness of gate electrode contact region
t2: Thickness of gate electrode non-contact region In the first aspect of the above-mentioned invention, preferably $0.8 \leq t2/t1 < 0.98$, and more preferably, $0.9 \leq t2/t1 \leq 0.98$.

The gate insulating film has a gate electrode contact region being in contact with a back side of the gate electrode, and a gate electrode non-contact region not being in contact with a back side of the gate electrode. Since the gate electrode non-contact region has a thickness less than the thickness of the gate electrode contact region, the gate insulating film has a step at the end part of the gate electrode. Therefore, a joint surface having different dielectric constants exist just below the end part of the gate electrode. That is, the first joint surface is a joint interface between the gate electrode and the gate insulating film, and a second joint surface is a joint interface between the passivation film and the gate insulating film. A polarization charge is generated on the second joint surface being a joint surface between dielectrics having different dielectric constants. The first joint surface and the second joint surface are shifted in the thickness direction of the gate insulating film, and a polarization charge is generated on the second joint surface, thereby separating the electric field concentration just below the end part of the gate electrode into two stages. To relax the electric field just below the end part of the gate electrode by the polarization charge generated on the second joint surface, a distance between the first joint surface and the second joint surface, that is, a thickness of the step needs to be within a. predetermined range. The part with a high electric field intensity is dispersed in this way, and the electric field concentration is relaxed in a vicinity of the outer edge part of the gate electrode. Density of polarization charge being generated on the second joint surface depends on the ratio $\varepsilon_2/\varepsilon_1$ of dielectric constant $\varepsilon_2$ of the passivation film to dielectric constant $\varepsilon_1$ of the gate insulating film. Therefore, to efficiently disperse the electric field intensity at the step, $1.5 \leq \varepsilon_2/\varepsilon_1$ is preferably satisfied. More preferably, $2.0 \leq \varepsilon_2/\varepsilon_1$ is satisfied. Although the larger $\varepsilon_2/\varepsilon_1$, the more preferable, $\varepsilon_2/\varepsilon_1 \leq 3$ is preferably satisfied. Thus, a desirable range of $\varepsilon_2/\varepsilon_1$ is $1.5 \leq \varepsilon_2/\varepsilon_1 \leq 3$, and more preferably, $2.0 \leq \varepsilon_2/\varepsilon_1 \leq 3$.

t2/t1<1 must be satisfied to make a step. When t2/t1 0.98, a step has a significant shape, which is desirable. $0.8 \leq t2/t1$ is a requisite for relaxing the electric field just below the end part of the gate electrode by the polarization charge generated on the second joint surface. When t2/t1<0.8, a distance between the first joint surface and the second joint surfaces becomes too large, and the effect of relaxing the electric field just below the end part of the gate electrode by the polarization charge generated on the second joint surface is reduced. It is not desirable. More preferably, when $0.9 \leq t2/t1$, the effect of relaxing the electric field just below the end part of the gate electrode by the polarization charge is large. Consequently, $0.9 \leq t2/t1 \leq 0.98$ is most preferable.

The gate electrode has a first side surface at an outer edge part thereof, and the gate insulating film has a second side surface at the step. The second side surface may exist on an extension of the first side surface. That is, the side surface of the step is located just below the end part of the gate electrode, and is perpendicular to the main surface of the gate electrode. The thickness of the gate electrode non-contact region is preferably constant and uniform in an entire area thereof.

The passivation film may be in contact with the first side surface of the gate electrode and the second side surface of the gate insulating film. The passivation film. may not be in contact with the gate electrode contact region of the gate insulating film, and may be in contact with the gate electrode non-contact region of the gate insulating film.

In a second aspect of the present invention, there is provided a method for producing a semiconductor device. In the present aspect, a gate insulating film is formed on a semiconductor layer, a gate electrode is formed on the gate insulating film, and a passivation film is formed on the gate electrode. The gate insulating film has a gate electrode contact region being in contact with the gate electrode, and a gate electrode non-contact region not being in contact with the gate electrode, and the passivation film has a dielectric constant higher than the dielectric constant of the gate insulating film. The gate insulating film is formed so that a thickness of the gate electrode contact region and a thickness of the gate electrode non-contact region satisfy the following equation.

$$0.8 < t2/t1 < 1$$

t1: Thickness of gate electrode contact region
t2: Thickness of gate electrode non-contact region In the second aspect of the present invention, to form a gate insulating film, a first insulating film is uniformly formed on the semiconductor layer, and to form a gate electrode, an electrode layer is uniformly formed on the first insulating film. A gate electrode non-contact region having a thickness t2 is formed by etching the electrode layer and the first insulating film in a region other than the region being remained as the gate electrode of the electrode layer.

In the present specification, there is provided a semiconductor device relaxing electric field concentration in a gate insulating film just below an end part of a gate electrode, and a production method therefor.

BRIEF DESCRIPTION OF THE DRAWINGS

Various other objects, features, and many of the attendant advantages of the present invention will. be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments will next be described with a semiconductor device and. a production method therefor being used as examples. However, the present invention is not limited to these embodiments. In the specification, first conductivity type indicates n-type, and second conductivity type indicates n-type. However, first conductivity type may indicate p-type, and second conductivity type may indicate n-type.

First Embodiment

1. Semiconductor Device

Figure 1:
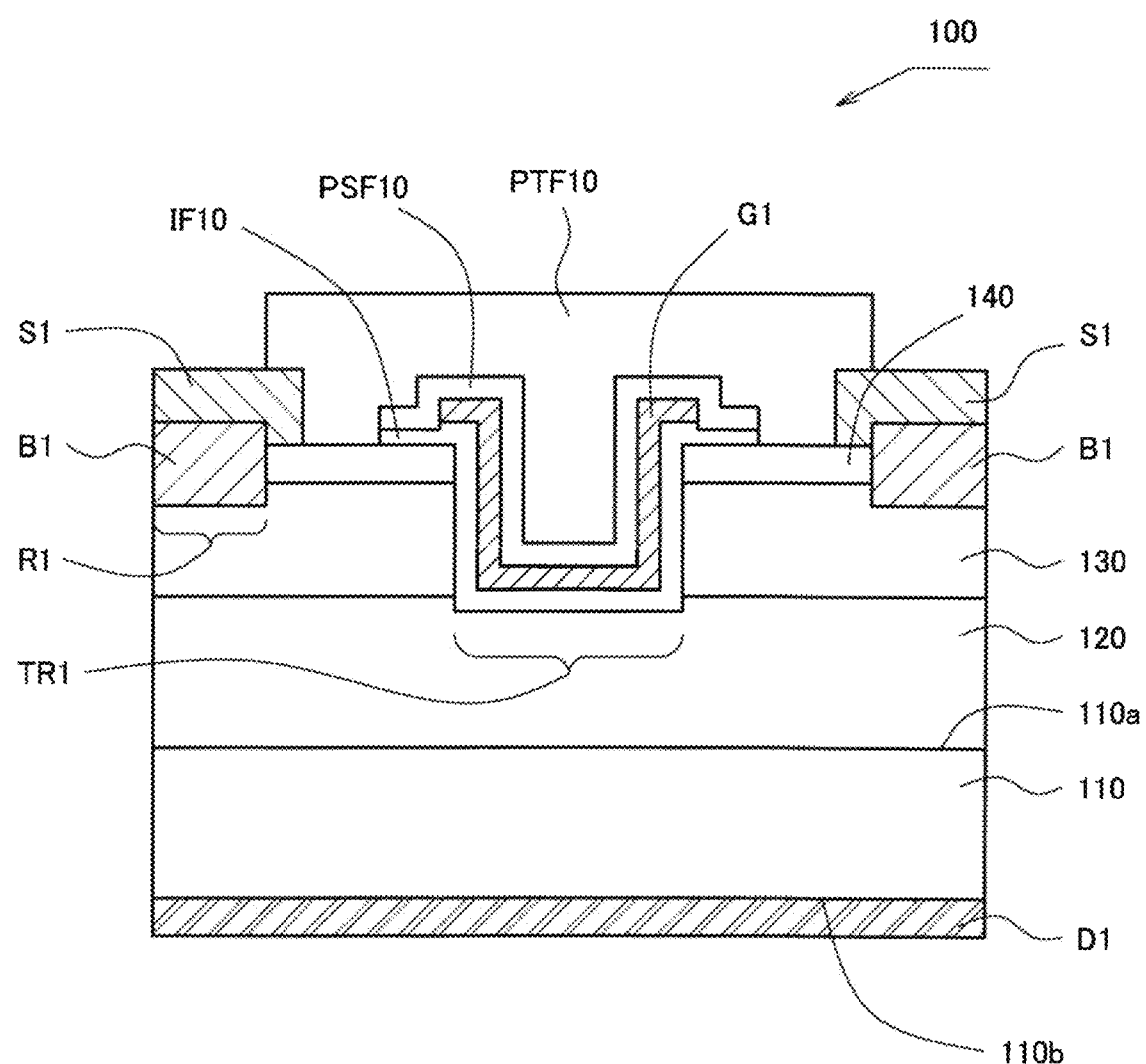
FIG. 1 is a schematic view of the structure of a semiconductor device 100 according to a first embodiment.

FIG. 1 is a schematic view of the structure of a semiconductor device 100 according to a first embodiment. The semiconductor device 100 is a vertical MOSFET. FIG. 3B is a plan view of a trench TR1 and a semiconductor layer. As shown in FIG. 1, the semiconductor device 100 includes a conductive substrate 110, a first semiconductor layer 120, a second semiconductor layer 130, a third semiconductor layer 140, a body electrode B1, a source electrode S1, a drain electrode D1, a gate electrode G1, a gate insulating film IF10, a passivation film PSF10, and a protective film PTF10. The gate electrode G1 has a gate pad electrode (not illustrated).

The conductive substrate 110 is made of a conductive material. The conductive substrate 110 has a first surface 110a and a second surface 130b. The first surface 110a and the second surface 110b have opposite polarities. The first surface 110a is a surface for forming a semiconductor layer thereon. The second surface 110b is a surface for forming a drain electrode D1 thereon. For example, the first surface 110a is a +c-plane (Ga plane), and the second surface 110b is a −c-plane (N plane). The conductive substrate 110 is, for example, a GaN substrate. Most of the GaN substrate is made of n-GaN. Other conductive material may be used as a conductive substrate 110. However, the conductive substrate 110 made of Group III nitride semiconductor is preferable for forming semiconductor thereon.

The first semiconductor layer 120 is formed on the first surface 110a of the conductive substrate 110. The first semiconductor layer 120 is a first conductivity type Group III nitride semiconductor layer. The first semiconductor layer 120 is made of, for example, n-GaN. The first semiconductor layer 120 has a thickness of, for example, 5 μm to 20 μm.

The second semiconductor layer 130 is formed on the first semiconductor layer 120. The second semiconductor layer 130 is a second conductivity type Group III nitride semiconductor layer. The second semiconductor layer 130 is made of, for example, p-GaN. The second semiconductor layer 130 has a thickness of, for example, 0.5 μm to 1.5 μm.

The third semiconductor layer 140 is formed on the second semiconductor layer 130. The third semiconductor layer 140 is a first conductivity type Group III nitride semiconductor layer. The third semiconductor layer 140 is made of, for example, n⁻-GaN. The third semiconductor layer 140 has a thickness of, for example, 0.1 μm to 0.6 μm.

The body electrode B1 is an electrode for extracting holes from the second semiconductor layer 130. The body electrode B1 is formed in a recess R1. The recess R1 is a recessed part passing through the third semiconductor layer 140, and reaching the upper portion of the second semiconductor layer 130. The body electrode B1 is in contact with the second semiconductor layer 130, the third semiconductor layer 140, and the source electrode S1.

The source electrode S1 is formed on the third semiconductor layer 140 and the body electrode B1. The source electrode S1 is in contact with the third semiconductor layer 140, and can inject electrons into the third semiconductor layer 140. The source electrode S1 is in contact with the body electrode B1, and the source electrode S1 and the body electrode B1 are equipotential.

The drain electrode D1 is formed on the second surface 110b of the conductive substrate 110. As described above, the second surface 110b is, for example, a −c-plane.

The gate electrode G1 is formed on the gate insulating film IF10 along a trench TR1. The trench TR1 is a recessed part passing through the third semiconductor layer 140 and the second semiconductor layer 130, and reaching the middle of the first semiconductor layer 120. A peripheral part of the gate electrode G1 extends toward the source electrode S1. The gate electrode G1 is not in direct contact with the semiconductor layer. The gate electrode G1 is made of, for example, TiN.

2. Peripheral Structure of Gate Insulating Film

Figure 2:
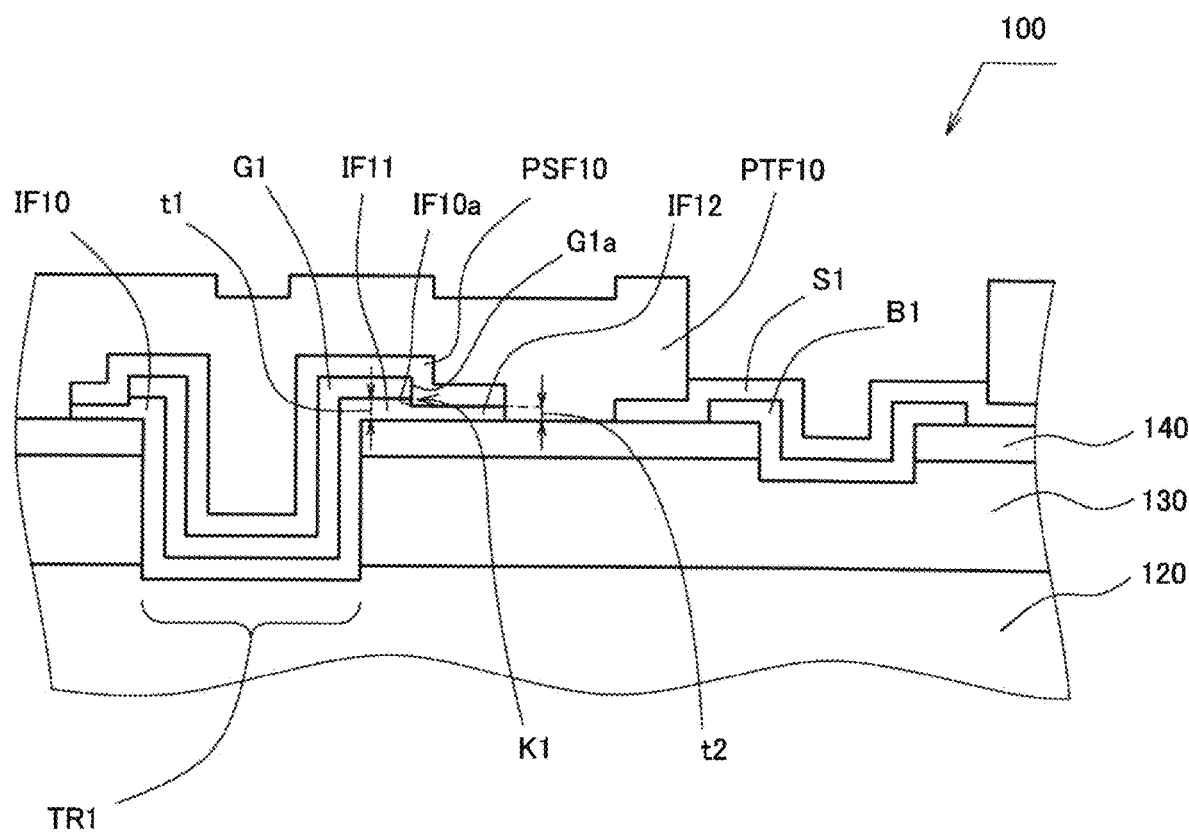
FIG. 2 is a view showing the peripheral structure of a gate insulating film IF10 of the semiconductor device 100 according to the first embodiment.

FIG. 2 is a view showing the peripheral structure of a gate insulating film IF10 of the semiconductor device 100 according to the first embodiment. As shown in FIG. 2, the gate insulating film IF10 is formed along the bottom surface and the side wall of the trench TR1 by joining with the semiconductor layer. The gate electrode G1 is formed on the surface of the gate insulating film IF10. The passivation film PSF10 is formed on the top surface of the gate electrode G1, and the top surface of the gate insulating film IF10 outside the gate electrode G1.

2-1. Gate Insulating Film

The gate insulating film IF10 insulates between the gate electrode G1 and each semiconductor layer. The gate insulating film IF10 is disposed between the gate electrode G1 and the third semiconductor layer 140. The gate insulating film IF10 is made of, for example, $SiO_2$.

The gate insulating film IF10 covers the bottom surface, the side surface, and the top surface around the opening of the trench TRI having a hexagonal lattice shape in a plan view. The gate insulating film IF10 covers the surface of the first semiconductor layer 120 exposed in the bottom surface of the trench TR1, the side surface of the first semiconductor layer exposed on the side surface of the trench TRI, the side surface of the second semiconductor layer 130, and the side surface of the third semiconductor layer 140. Moreover, the gate insulating film IF10 covers a part of the surface of the third semiconductor layer 140 around the opening of the trench TR1.

The gate insulating film IF10 is in contact with the first semiconductor layer 120, the second semiconductor layer 130, and the third semiconductor layer 140 in the trench TRI, and in contact with the surface of the third semiconductor layer 140. The gate insulating film. IF10 is in contact with the gate electrode G1.

The gate insulating film IF10 has a gate electrode contact region IF11 being in contact with the gate electrode G1 and a gate electrode non-contact region IF12 not being in contact with the gate electrode G1. The gate electrode contact region IF11 is disposed just below the end part of the gate electrode G1. The gate electrode non-contact region IF12 is disposed outside the outer edge of the gate electrode G1.

The gate insulating film IF10 has a step K1 at an interface between the gate electrode contact region IF11 and the gate electrode non-contact region IF12 Due to the step K1, the top surface of the gate electrode non-contact region IF12 is not flush with an extension surface of the top surface of the gate electrode contact region IF11.

The gate insulating film IF10 has a side surface IF10a at the step K1. The side surface IF10a of the gate insulating film IF10 is a boundary surface between the gate electrode contact region IF11 and the gate electrode non-contact region IF12. The gate electrode G1 has a side surface G1a at an outer edge part thereof. The side surface IF10a of the gate insulating film IF10 is flush with the side surface G1a of an extension surface of the gate electrode G1. In design, the side surface IF10a and the side surface G1a are perpendicular to the main surface of the conductive substrate 120. Needless to say, due to the processing accuracy in the production method described later, an extension surface of the side surface IF10a of the gate insulating film IF10 may not be slightly flush with the side surface G1a of the gate electrode G1 within the processing accuracy range.

The thickness t1 of the gate electrode contact region IF11 is larger than the thickness t2 of the gate electrode non-contact region IF12. The thickness t1 of the gate electrode contact region IF11 is, for example, 40 nm to 160 nm.

The thickness t1 of the gate electrode contact region IF11 and the thickness t2 of the gate electrode non-contact region IF12 satisfy the following equation.

$$0.8 \leq t2/t1 < 1 \quad (1)$$

t1: Thickness of gate electrode contact region
t2: Thickness of gate electrode non-contact region The thickness t1 of the gate electrode contact region IF11 and the thickness t2 of the gate electrode non-contact region IF12 preferably satisfy the following equation.

$$0.9 \leq t2/t1 < 0.98 \quad (2)$$

t1: Thickness of gate electrode contact region
t2: Thickness of gate electrode non-contact region 2-2. Passivation Film The passivation film PSF10 suppresses transfer of charges between the gate electrode G1 and the outside. The passivation film PSF10 covers the gate electrode G1, the side surface IF10a of the gate insulating film IF10, and the top surface IF12a of the gate electrode non-contact region IF12. The passivation film PSF10 is in contact with the gate electrode G1, the gate electrode non-contact region IF12 of the gate insulating film IF10, and the protective film PTF10. The passivation film PSF10 is not in contact with the top surface of the gate electrode contact region IF11 of the gate insulating film IF10.

The passivation film PSF10 is in contact with the side surface G1a of the gate electrode G1 and the side surface IF10a of the gate insulating film IF10. The side surface IF10a of the gate insulating film IF10 is disposed at an interface between the gate electrode contact region IF11 and the gate electrode non-contact region IF12. At the side surface IF10a, the thickness of the gate insulating film IF10 is varied. The passivation film PSF10 is formed along the step K1 of the gate insulating film IF10.

The passivation film PSF10 has a thickness of, for example, 50 nm to 200 nm.

The passivation film PSF10 has a dielectric constant higher than the dielectric constant of the gate insulating film IF10. The passivation film PSF10 is made of, for example, $Al_2O_3$.

2-3. Protective Film

The protective film. PTF10 protects the surface of the semiconductor layer. The protective film PTF10 covers the third semiconductor layer 140 and the passivation film PSF10. The protective film PTF10 is in contact with the third semiconductor layer 140, the passivation film PSF10, the side surface of the gate insulating film IF10, and a part of the source electrode S1.

The protective film. PTF10 has a thickness of, for example, 300 nm to 1,000 nm. The protective film PTF10 is made of, for example, $SiO_2$.

3. Electric Field in a Vicinity of Gate Insulating Film

Figure 3A:
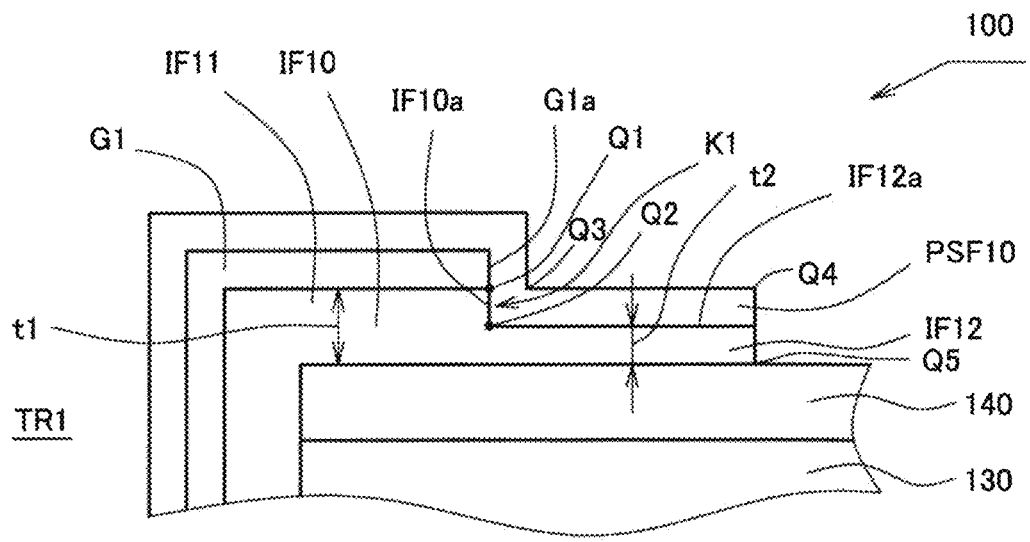
FIGS. 3A and 3B are views for explaining an electric field in a vicinity of the gate insulating film IF10 of the semiconductor device 100 according to the first embodiment.
Figure 3B:
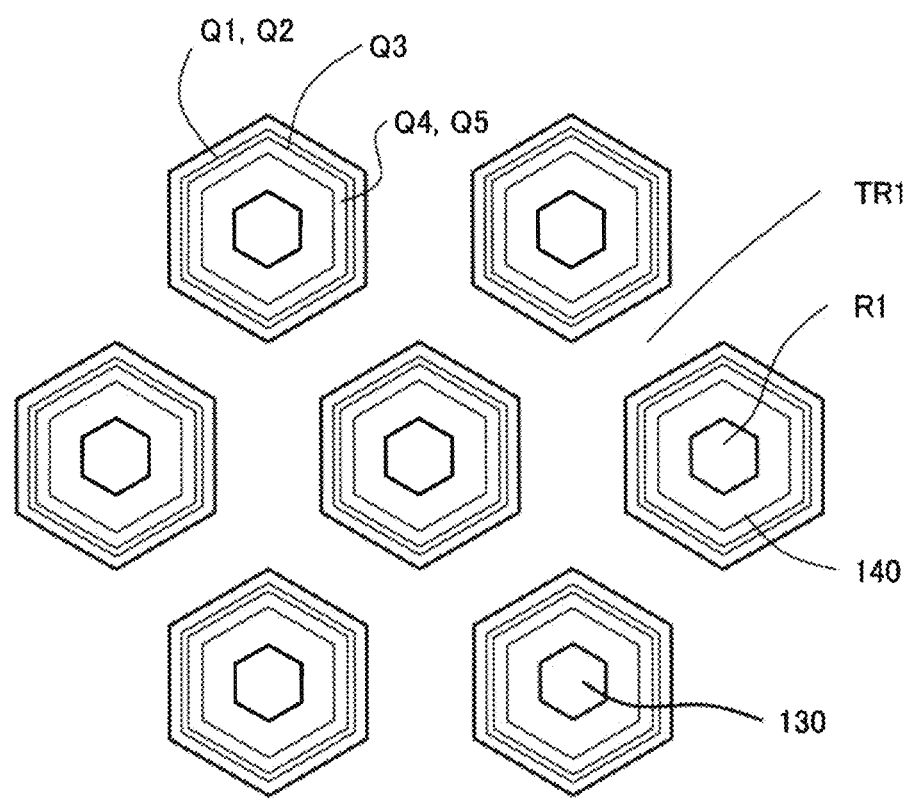

FIGS. 3A and 3B are views for explaining an electric field in a vicinity of the gate insulating film IF10 of the semiconductor device 100 according to the first embodiment.

In the first embodiment, the thickness t1 of the gate electrode contact region IF11 in contact with a backside of the gate electrode G1 is large, and the thickness t2 of the gate electrode non-contact region IF12 outside the gate electrode G1 is small. These thicknesses t1 and t2 satisfy the equation (1).

The passivation film PSF10 has a dielectric constant higher than the dielectric constant of the gate insulating film IF10.

As shown in FIG. 3B, the trench TR1 is formed in a hexagonal lattice shape. The semiconductor layer other than the trench TR1 has a hexagonal shape. As shown in FIG. 3A, electric field intensity is high at edge Q1 and edge Q2 around the side surface G1a of the gate electrode G1. The edges Q1 and Q2 are formed in a hexagonal lattice shape when seen from above. The source electrode S1 is disposed inside the hexagonal lattice.

The edge Q1 is a contour line of the interface between the gate electrode G1 and the gate electrode contact region IF11 of the gate insulating film IF10. At the edge Q1, the gate electrode G1, the gate insulating film IF10, and the passivation film PSF10 are contacted with each other.

The edge Q2 is a line of intersection between the side surface IF10a of the gate electrode contact region IF11 and the top surface IF12a of the gate electrode non-contact region IF12. The line of intersection is on an interface between the gate electrode contact region IF11 and the gate electrode non-contact region IF12. The top surface IF12a of the gate electrode non-contact region IF12 is a surface opposite to the surface at which the gate insulating film IF10 is in contact with the semiconductor layer. At the edge Q2, the gate insulating film IF10 and the passivation film PSF10 are contacted with each other, and the passivation film PSF10 forms a corner.

As described later, an electric field around the side surface G1a of the gate electrode G1 is high at the edge Q1 and the edge Q2. The high electric field is separated into the edge Q1 and the edge Q2, thereby relaxing the electric field concentration around the side surface G1a of the gate electrode G1. That is, the generation of a local high electric field is suppressed around the side surface G1a of the gate electrode G1.

4. Method for Forming Gate Insulating Film

In the first embodiment, a gate insulating film IF10 is formed together with a gate electrode G1.

4-1. Step of Forming Insulating Film (Step of Forming Gate Insulating Film)

Figure 4:
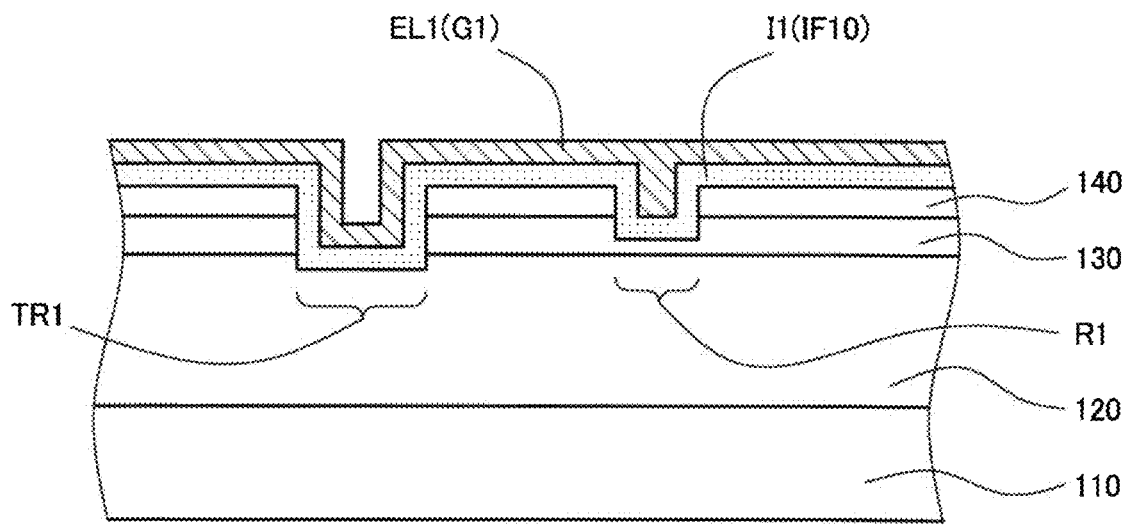
FIG. 4 is a view (part 1) explaining a method for forming the gate insulating film IF10 of the semiconductor device 100 according to the first embodiment.

As shown in FIG. 4, an insulating film I1 is uniformly formed on the surface of the third semiconductor layer 140 having the trench TR1 and the recess R1. This insulating film I1 becomes the gate insulating film IF10. The insulating film I1 may be formed by reactive sputtering, CVD, ALD, and other method. In ALD, ozone or oxygen plasma may be used as an oxygen source. The insulating film I1 has a thickness of, for example, 40 nm to 160 nm. Moreover, heat treatment may be performed for the insulating film I1.

4-2. Step of Forming Electrode Layer (Step of Forming Gate Electrode)

As shown in FIG. 4, an electrode layer EL1 is uniformly formed on the uniform insulating film I1. The electrode layer EL1 is a metal layer or an alloy layer becoming the gate electrode G1. Therefore, the deposition structure of the electrode layer EL1 is the same as that of the gate electrode G1.

4-3. Step of Coating Resist

Figure 5:
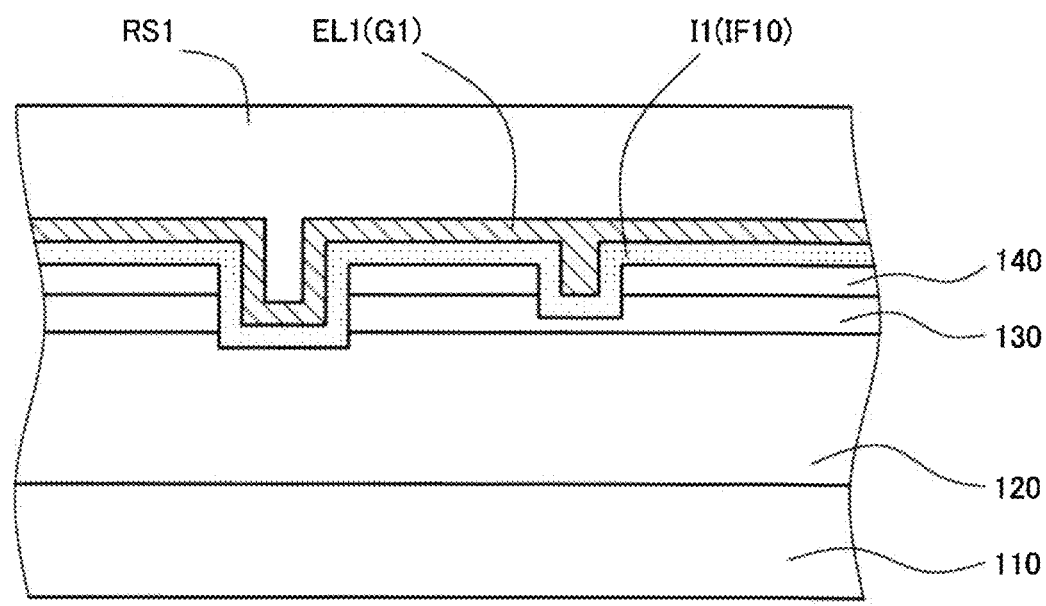
FIG. 5 is a view (part 2) explaining the method for forming the gate insulating film IF10 of the semiconductor device 100 according to the first embodiment.

As shown in FIG. 5, resist RS1 is applied to the electrode layer EL1.

4-4. Step of Exposing and Developing

Figure 6:
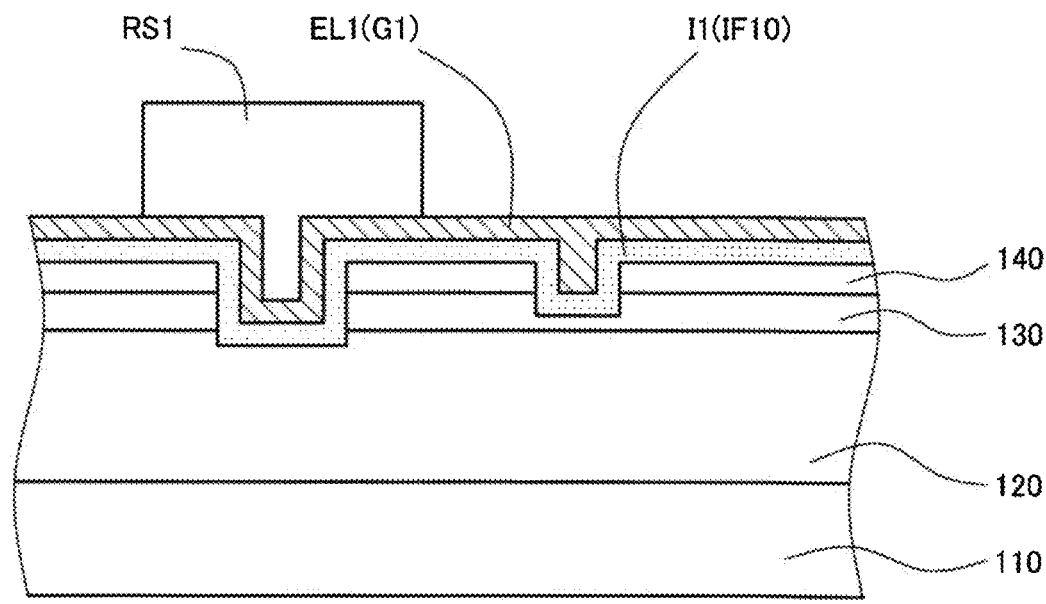
FIG. 6 is a view (part 3) explaining the method for forming the gate insulating film IF10 of the semiconductor device 100 according to the first embodiment.

As shown in FIG. 6, a part of the resist RS1 is exposed to light and developed to partially remove the resist RS1. The electrode layer EL1 just below the remaining resist RS1 is a region being remained as the gate electrode G1.

4-5. Etching
4-5-1. Step of Etching Gate Electrode

Figure 7:
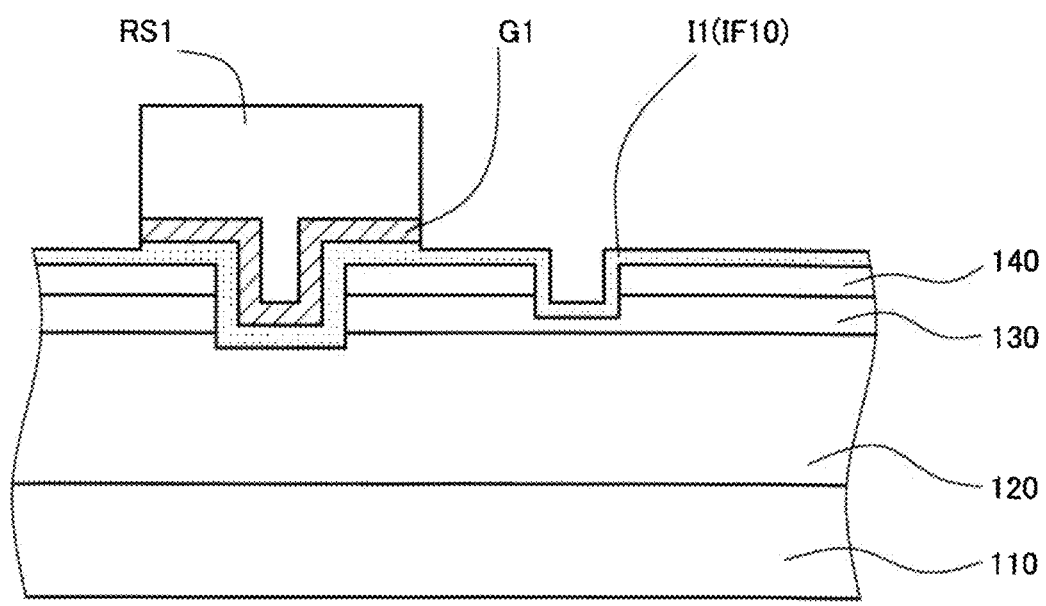
FIG. 7 is a view (part 4) explaining the method for forming the gate insulating film IF10 of the semiconductor device 100 according to the first embodiment.

As shown in FIG. 7, the electrode layer EL1 is etched. For example, the electrode layer EL1 is etched by ICP using a mixture gas of $Cl_2$ and $BCl_3$. Thus, the electrode layer EL1 not covered with the resist RS1 is removed. That is, a region other than a region being remained as the gate electrode G1 of the electrode layer EL1 is etched.

4-5-2. Step of Etching Gate Insulating Film

Etching is continued. The insulating film I1 below the electrode layer EL1 is etched until the thickness becomes t2. Thus, the thickness of the insulating film I1 in the region covered with the resist RS1 is t1, and the thickness of the insulating film I1 in the region not covered with the resist RSI is t2. That is, the gate electrode non-contact region IF12 is etched until the thickness of the gate electrode non-contact region IF12 becomes t2. In this way, the gate electrode contact region IF11 and the gate electrode non-contact region IF12 are formed.

4-6. Step of Removing Resist

Figure 8:
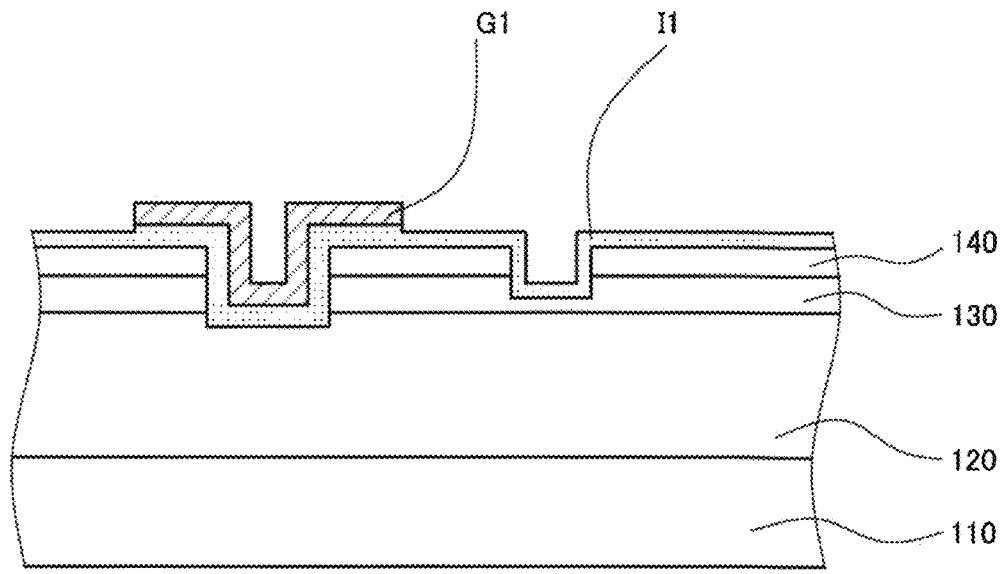
FIG. 8 is a view (part 5) explaining the method for forming the gate insulating film IF10 of the semiconductor device 100 according to the first embodiment.

As shown in FIG. 8, the resist RS1 is peeled off and removed.

4-7. Step of Exposing Semiconductor

Subsequently, the insulating film I1 existing in a region for forming the body electrode B1 and the source electrode S1, is removed. Thus, the semiconductor layer for forming the body electrode B1 and the source electrode S1 thereon is exposed. For example, etching may be performed using a fluorine-based gas such as $CF_4$ and $C_4F_6$. In this case, resist may be separately used.

5. Method for Producing Semiconductor Device
5-1. Step of Forming Semiconductor Layer For convenience of description, steps 4-1 to 4-7 were described in advance. However, actually, this step of forming semiconductor layer is performed before the step of forming insulating film.

A first semiconductor layer 120, a second semiconductor layer 130, and a third semiconductor layer 140 are grown in this order on a conductive substrate 110. For example, MOCVD may be used, or other vapor phase growth method may be used.

5-2. Step of Forming Recessed Part

A trench TR1 and a recess R1 are formed. Dry etching may be used. For example, etching may be performed by ICP using a chlorine-based gas.

5-3. Step of Forming Gate Insulating Film and Gate Electrode

A gate insulating film IF10 and a gate electrode G1 are formed on the third semiconductor layer 140. The above-mentioned step of forming insulating film may be used.

5-4. Step of Forming Passivation Film

Subsequently, a passivation film PSF10 is formed on the gate electrode G1. For example, after the passivation film PSF10 is formed on the entire top surface of the gate electrode G1, an unnecessary part may be removed using resist to obtain the structure shown in FIG. 2.

5-5. Step of Forming Body Electrode

A body electrode B1 is formed at the recess R1. A deposition technique such as ALD and sputtering may be used.

5-6. Step of Forming Source Electrode

A source electrode S1 is formed on the body electrode B1. Sputtering, EB vapor deposition method, and resistance heating deposition method may be used.

5-7. Step of Forming Drain Electrode

A drain electrode D1 is formed on a second surface 110b of the conductive substrate 110. Sputtering, EB vapor deposition method, and resistance heating deposition method may be used.

5-8. Step of Forming Protective Film

Subsequently, a part other than the pad electrode of each electrode is covered by a protective film PTF10.

5-9. Step of Cutting Wafer

A semiconductor device 100 having a plurality of unit cells as shown in FIG. 3B is cut out from a wafer to produce a plurality of independent semiconductor devices 100.

5-10. Other Steps in addition to the aforementioned steps, other step such as heat treatment step and wet etching step may be carried out. In this way, the semiconductor device 100 shown in FIG. 1 is produced.

6. Effects of First Embodiment

The gate insulating film IF10 of the semiconductor device 100 according to the first embodiment has a gate electrode contact region IF11 and a gate electrode non-contact region IF12. The thickness t1 of the gate electrode contact region IF11 and the thickness t2 of the gate electrode non-contact region IF12 satisfy the following equation $0.8 \leq t2/t1 < 1$. Therefore, as shown in FIGS. 3A and 3B, a relatively high electric field is formed at the edge Q1 and the edge Q2. Since the high electric field is separated in this way, the electric field concentration is relaxed in a vicinity of the gate insulating film IF10 around the outer edge part of the gate electrode G1. As a result, a sudden flow of current is suppressed between the gate electrode G1 and the source electrode S1. Thereby, the breakdown voltage of the semiconductor device 100 is increased as compared with the conventional semiconductor device.

7. Variations
7-1. Material of Gate Insulating Film

The gate insulating film IF10 may be made of any one of oxide such as $SiO_2$, $Ga_2O_3$, MgO, $ZrO_2$, $Al_2O_3$, $TiO_2$, and $Gd_2O_3$, nitride such as SiN and AlN, and oxynitride such as SiON and AlON. However, the gate insulating film IF10 has a dielectric constant lower than the dielectric constant of the passivation film PSF10.

7-2. Material of Passivation Film

The passivation film PSF10 may be made of any one of oxide such as $SiO_2$, $Ga_2O_3$, MgO, $ZrO_2$, $Al_2O_3$ $TiO_2$, and $Gd_2O_3$, nitride such as SiN and AlN, and oxynitride such as SiON and AlON. However, the passivation film PSF10 has a dielectric constant lower than the dielectric constant of the gate insulating film IF10.

7-3. Material of Protective Film

The protective film PTF10 may be made of any one of oxide such as $SiO_2$, $Ga_2O_3$, MgO, $ZrO_2$, $Al_2O_3$, $TiO_2$, and Gd$_2$O$_3$, nitride such as SiN and AlN, oxynitride such as SiON and AlON, and organic insulating film such as polyimide.

7-4. Substrate

The conductive substrate 110 may be a conductive substrate other than the GaN substrate. Other conductive substrate is, for example, a conductive Si substrate.

7-5. Semiconductor Type

The semiconductor layer may be semiconductor other than Group III nitride semiconductor layer.

7-6. Etching

In the first embodiment, etching is performed by continuously carrying out the step of etching gate electrode and the step of etching gate insulating film. The step of etching gate electrode and the step of etching gate insulating film may be separately carried out. For example, an etching gas may be switched between the step of etching gate electrode and the step of etching gate insulating film. For example, the step of etching gate electrode may be carried out by plasma etching using a chlorine-based gas, and the step of etching gate insulating film may be carried out by plasma etching using a fluorine-based gas. The step of etching gate electrode may be carried out by dry etching, and the step of etching gate insulating film may be carried out by wet etching. For example, hydrofluoric acid may be used in wet etching. Etching may be either dry etching or wet etching. However, it depends on the material of the gate electrode G1 and the gate insulating film IF10.

7-7. Etching Rate

Etching rate may be different between the step of etching gate electrode and the step of etching gate insulating film. To remain the gate insulating film IF10, the etching rate of the gate insulating film IF10 is preferably lower than the etching rate of the gate electrode G1. The etching rate of the gate electrode G1 is, for example, 100 nm/min to 250 nm/min. The etching rate of the gate insulating film IF10 is, for example, 15 nm/min to 50 nm/min.

7-8. Step of Forming Passivation Film

A passivation film PSF10 is formed after the formation of the gate insulating film IF10 and the gate electrode G1. After the formation of the passivation film PSF10, the step of exposing semiconductor may be carried out to expose the semiconductor layer for forming a body electrode E1 and a source electrode S.

7-9. Other Steps

A gate electrode contact region IF11 and a gate electrode non-contact region IF12 may be formed by a method other than etching. For example, an insulating film is formed so as to have a thickness t2 of the gate electrode non-contact region IF12. After that, an insulating film of the gate electrode contact region IF11 is formed up to a thickness t1 of the gate electrode contact region IF11.

7-10. Combinations

The above variations may be combined with one another without any restriction.

Second Embodiment

A second embodiment will be described.

1. Semiconductor Device

Figure 9:
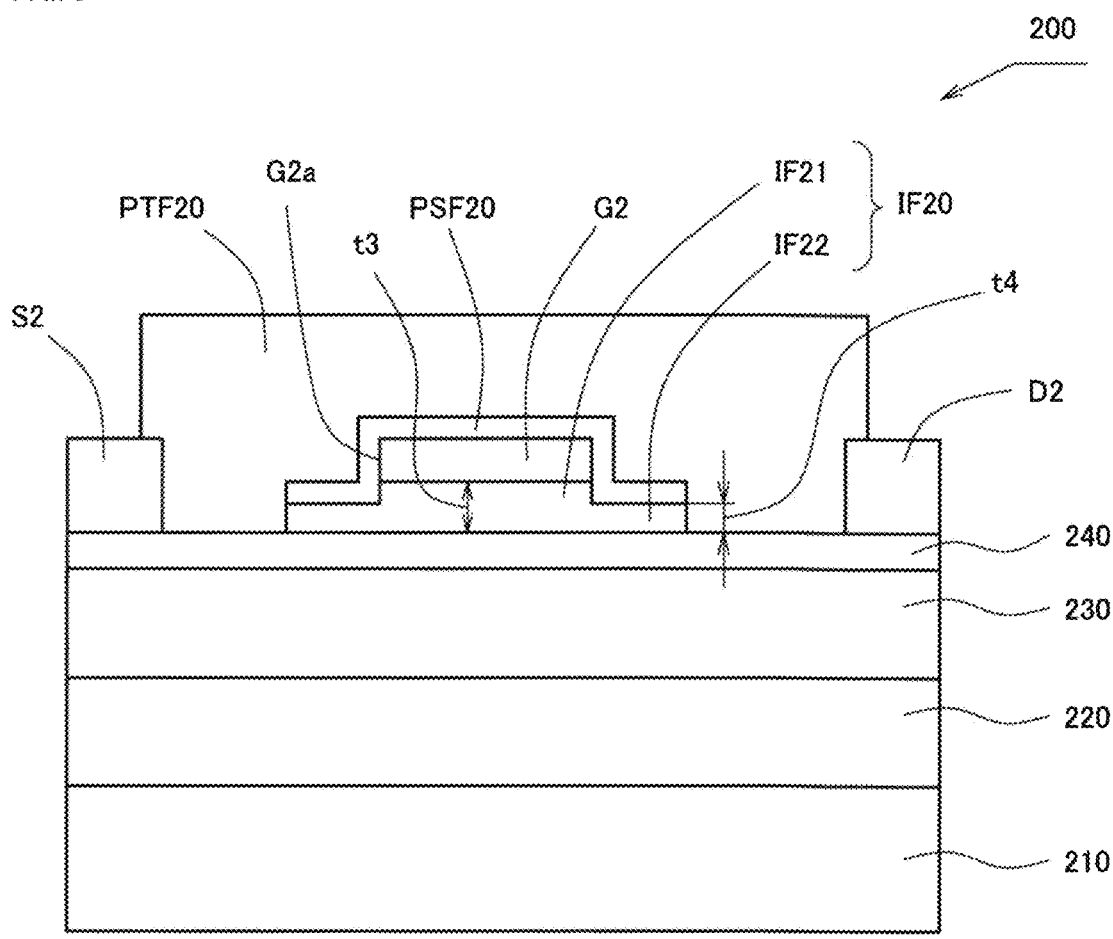
FIG. 9 is a schematic view of the structure of a semiconductor device 200 according to a second embodiment.

FIG. 9 is a schematic view of the structure of a semiconductor device 200 according to a second embodiment. The semiconductor device 200 is a lateral HEMT. The semiconductor device 200 includes a substrate 210, a first semiconductor layer 220, a second semiconductor layer 230, a third semiconductor layer 240, a source electrode S2, a drain electrode D2, a gate electrode G2, a gate insulating film IF20, a passivation film PSF20, and a protective film PTF20. The semiconductor device 200 does not have a trench. Moreover, the semiconductor device 200 has a gate pad electrode (not illustrated).

The first semiconductor layer 220, the second semiconductor layer 230, and the third semiconductor layer 240 are a Group III nitride semiconductor layer. The first semiconductor layer 220 is a base layer. The first semiconductor layer 220 is, for example, a GaN layer. The second semiconductor layer 230 is a carrier travel layer, i.e., a channel formed layer. The second semiconductor layer 230 is, for example, a GaN layer. The third semiconductor layer 240 is a carrier supply layer. The third semiconductor layer 240 is, for example, a AlGaN layer.

The gate insulating film IF20 has a gate electrode contact region IF21 and a gate electrode non-contact region IF22.

The thickness t3 of the gate electrode contact region IF21 and the thickness t4 of the gate electrode non-contact region IF22 satisfy the following equation.

$$0.8 \le t4/t3 < 1 \tag{3}$$

t3: Thickness of gate electrode contact region
t4: Thickness of gate electrode non-contact region The thickness t3 of the gate electrode contact region IF21 and the thickness t4 of the gate electrode non-contact region IF22 preferably satisfy the following equation.

$$0.9 \le t4/t3 \le 0.98 \tag{4}$$

t3: Thickness of gate electrode contact region
t4: Thickness of gate electrode non-contact region

2. Effects of Second Embodiment

The gate insulating film IF20 of the semiconductor device 200 according to the second embodiment has a gate electrode contact region IF21 and a gate electrode non-contact region IF22. The thickness t3 of the gate electrode contact region IF21 and the thickness t4 of the gate electrode non-contact region. IF22 satisfy the following equation: 0.8≤t4/t3<1. Therefore, as in the first embodiment, the generation of a high electric field is suppressed at the edge of the gate insulating film IF20 around the side surface G1a of the gate electrode G2.

3. Variations

The first embodiment and variations may be combined with one another without any restriction.

(Simulation)

Simulation was performed to obtain the electric field intensity distribution when the thickness of the gate electrode contact region and the thickness of the gate electrode non-contact region are varied in the gate insulating film. The gate insulating film was made of SiO$_2$. In simulation, a relative dielectric constant $\varepsilon_1$ of SiO$_2$ was 3.9. The passivation film was made of Al$_2$O$_3$. In simulation, a relative dielectric constant $\varepsilon_2$ of Al$_2$O$_3$ was 9.0. Accordingly, $\varepsilon_2/\varepsilon_1$ is equal to 2.3.

1. Part with High Electric Field Intensity

1-1. When Equation (1) is Satisfied

Figure 10:
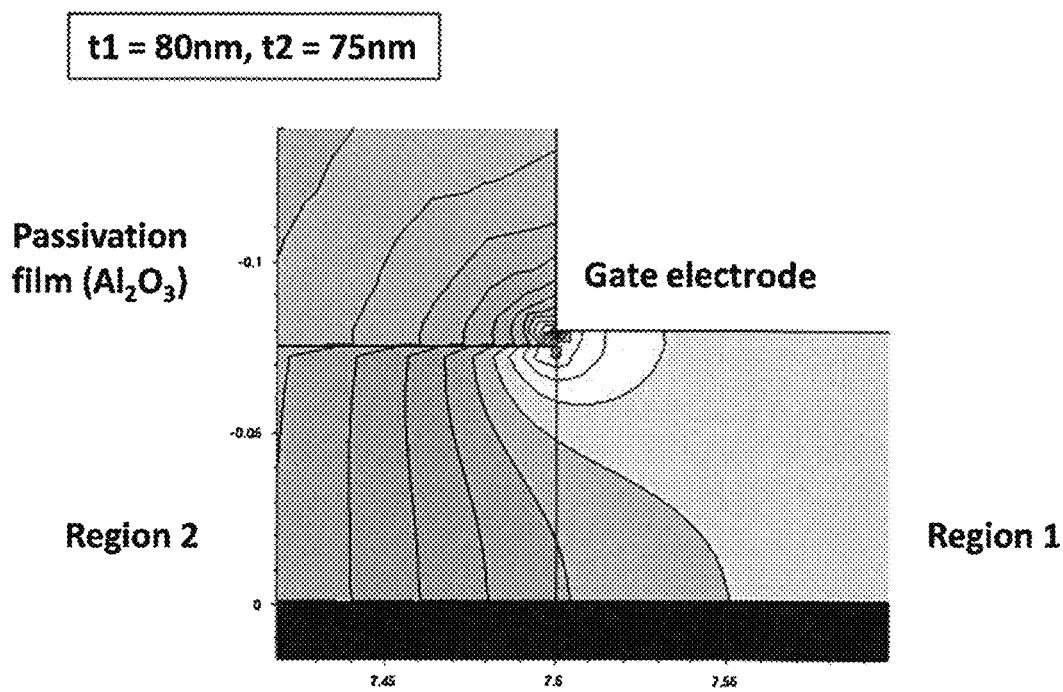
FIG. 10 is a map showing the electric field intensity distribution when the thickness t1 of the gate electrode contact region is 80 nm and the thickness t2 of the gate electrode non-contact region is 75 nm.

FIG. 10 is a map showing the electric field intensity distribution when the thickness t1 of the gate electrode contact region is 80 nm and the thickness t2 of the gate electrode non-contact region is 75 nm. In FIG. 10, a gate electrode is disposed in a region indicated with "Gate electrode". The gate electrode is a metal, and the surface of the gate electrode is equipotential. In FIG. 10, "Region 1" corresponds to the gate electrode contact region. "Region 2" corresponds to the gate electrode non-contact region. "Passivation film" corresponds to the passivation film.

In FIG. 10, t2/t1 is 0.9375. As shown in FIG. 10, the electric field is high at two edges corresponding to the edge Q1 and the edge Q2 of FIGS. 3A and 3B. In this case, a part where a high electric field is generated is separated into two parts. Therefore, the electric field intensity at the edge Q1 and the edge Q2 is lower than the electric field intensity when the high electric field is not separated in the two parts.

1-2. When Equation (1) is Not Satisfied (t1=t2)

Figure 11:
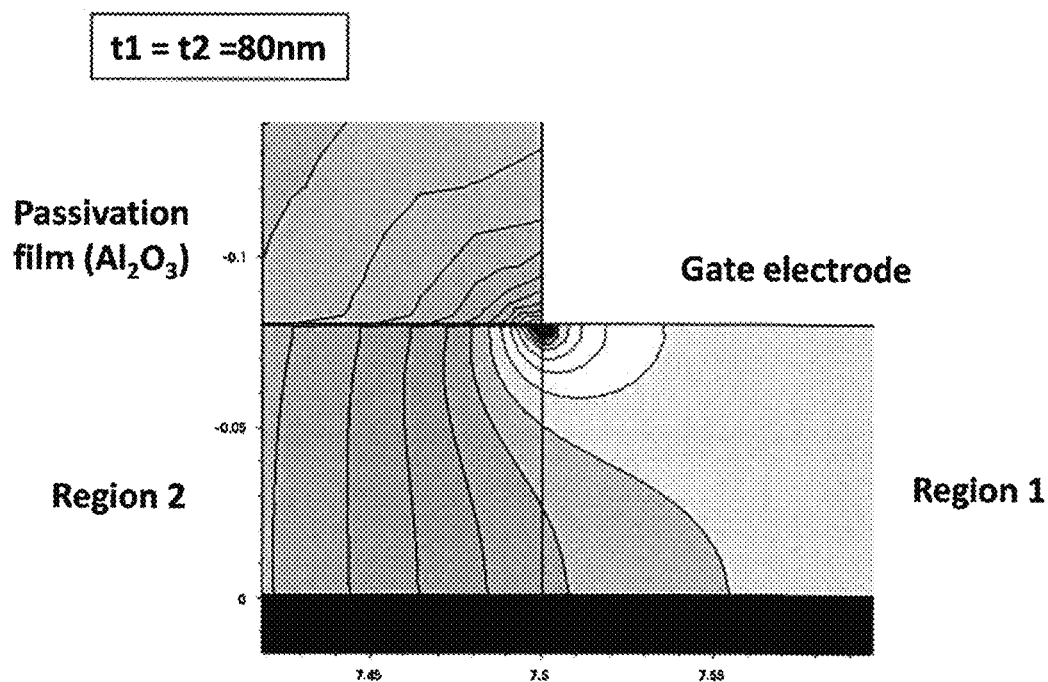
FIG. 11 is a map showing the electric field intensity distribution when the thickness t1 of the gate electrode contact region is 80 nm and the thickness t2 of the gate electrode non-contact region is 80 nm.

FIG. 11 is a map showing the electric field intensity distribution when the thickness t1 of the gate electrode contact region is 80 nm and the thickness t2 of the gate electrode non-contact region is 80 nm. In this case, the thickness t1 of the gate electrode contact region is equal to the thickness t2 of the gate electrode non-contact region. In FIG. 11, t2/t1 is 1. A high electric field is generated at a part in contact with the gate electrode of the contact surface between $SiO_2$ and $Al_2O_3$.

1-3. When Equation (1) is Not Satisfied (t1=2·t2)

Figure 12:
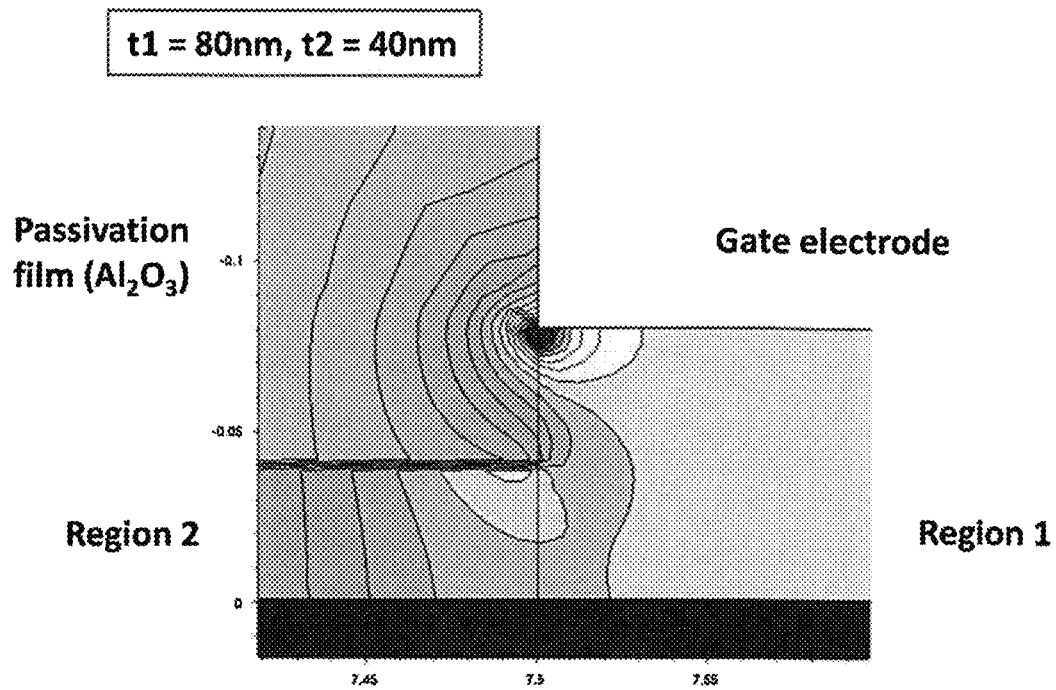
FIG. 12 is a map showing the electric field intensity distribution when the thickness t1 of the gate electrode contact region is 80 nm and the thickness t2 of the gate electrode non-contact region is 40 nm.

FIG. 12 is a map showing the electric field intensity distribution when the thickness t1 of the gate electrode contact region is 80 nm and the thickness t2 of the gate electrode non-contact region is 40 nm. In this case, in FIG. 12, t2/t1 is 0.5. As in FIG. 11, a high electric field is generated at a part in contact with the gate electrode of the contact surface between $SIC_2$ and $Al_2O$.

1-4. When equation (1) is not satisfied (t1=8·t2)

Figure 13:
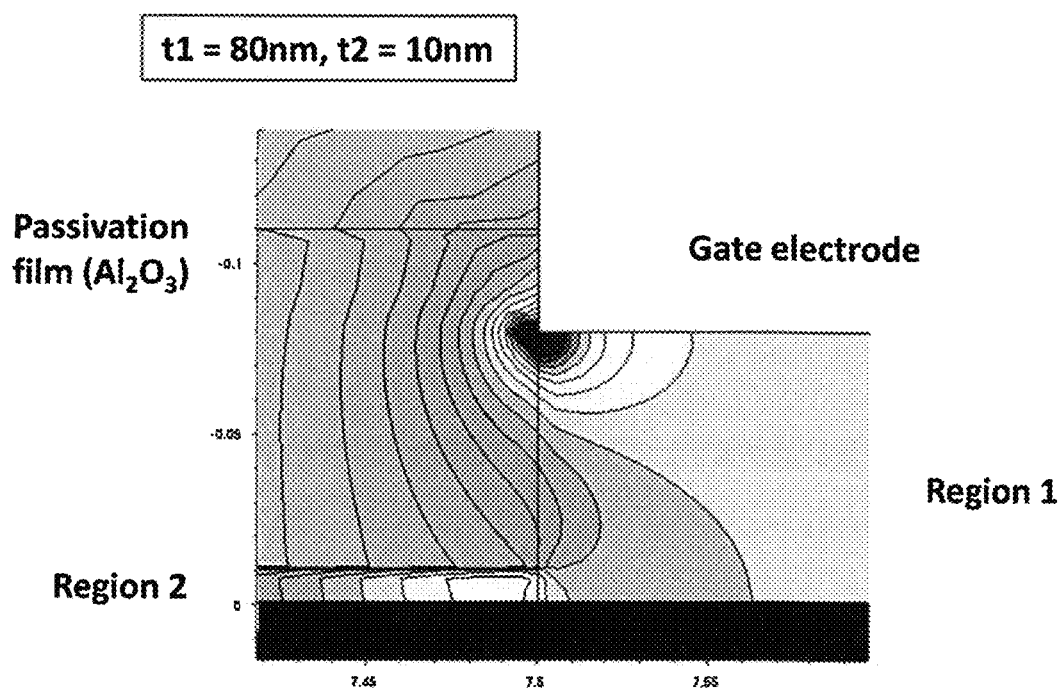
FIG. 13 is a map showing the electric field intensity distribution when the thickness t1 of the gate electrode contact region is 80 nm and the thickness t2 of the gate electrode non-contact region is 10 nm.

FIG. 13 is a map showing the electric field intensity distribution when the thickness t1 of the gate electrode contact region is 80 nm and the thickness t2 of the gate electrode non-contact region is 10 nm. In this case, in FIG. 13, t2/t1 is 0.125. As in FIG. 11, a high electric field is generated at a part in contact with the gate electrode of the contact surface between $SiO_2$ and $Al_2O_3$, 1-5. Summary of Simulation Thus, when the equation (1) is satisfied, a high electric field is generated at two edges corresponding to the edge Q1 and the edge Q2 of FIGS. 3A and 3B. A part where a high electric field is generated is separated into two parts, thereby reducing the maximum electric field intensity at the edge Q1 and the edge Q2 as compared with the conventional semiconductor device.

2. Maximum Electric Field Intensity

Simulation was performed for variation of the maximum electric field intensity in the gate insulating film when the thickness t1 of the gate electrode contact region is 80 nm or 50 nm and the thickness t2 of the gate electrode non-contact region is varied.

Figure 14A:
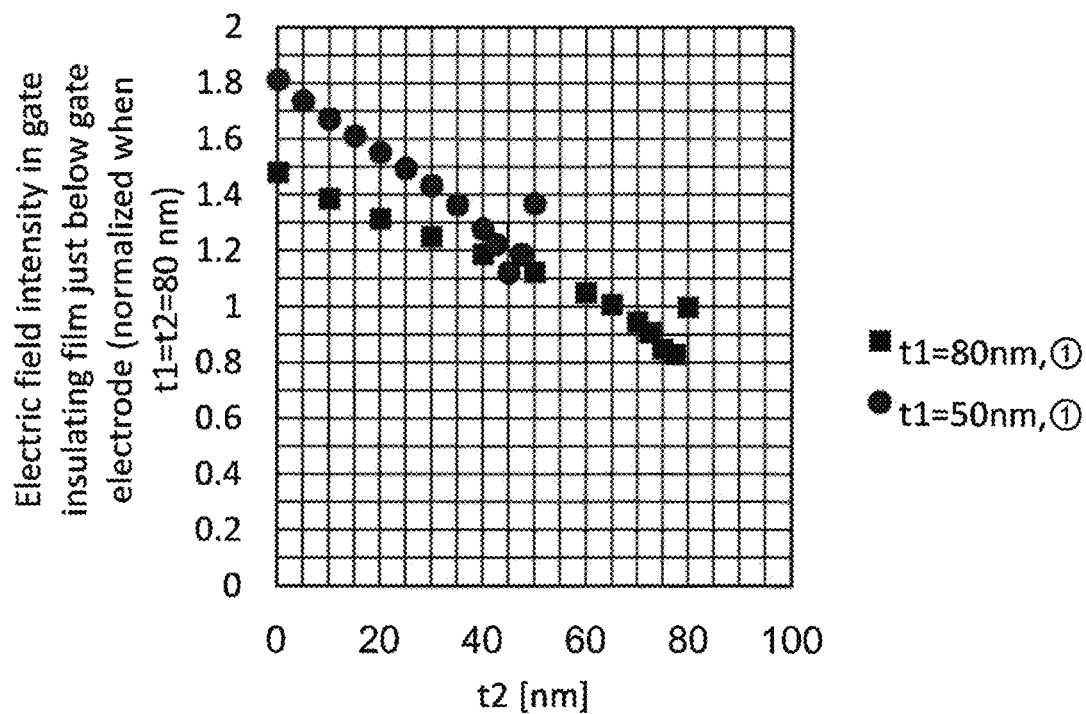
FIG. 14A is a graph showing the maximum. electric field intensity, normalized by the electric field intensity when the gate insulating film has a constant thickness of 80 nm, when the thickness t1 of the gate electrode contact region is 80 nm or 50 nm and the thickness t2 of the gate electrode non-contact region is varied.

FIG. 14A is a graph showing the maximum electric field intensity in the gate insulating film when the thickness t1 of the gate electrode contact region is 80 nm or 50 nm and the thickness t2 of the gate electrode non-contact region is varied. The horizontal axis of FIG. 14A indicates the thickness t2 of the gate electrode non-contact region. The vertical axis of FIG. 14A indicates the maximum electric field intensity in the gate insulating film. The electric field intensity in the gate insulating film differs depending on the part of the gate insulating film as described above. The vertical axis of FIG. 14A is normalized by the maximum electric field intensity in the gate insulating film when the thickness t1 of the gate electrode contact region is 80 nm and the thickness t2 of the gate electrode non-contact region is 80 nm.

As shown in FIG. 14A, the maximum electric field intensity in the gate insulating film is small in a region where the thickness t2 of the gate electrode non-contact region is 65 nm to 80 nm when t1=80 nm. That is, in this case, the maximum electric field intensity in the gate insulating film is smaller than 1.

Figure 15A:
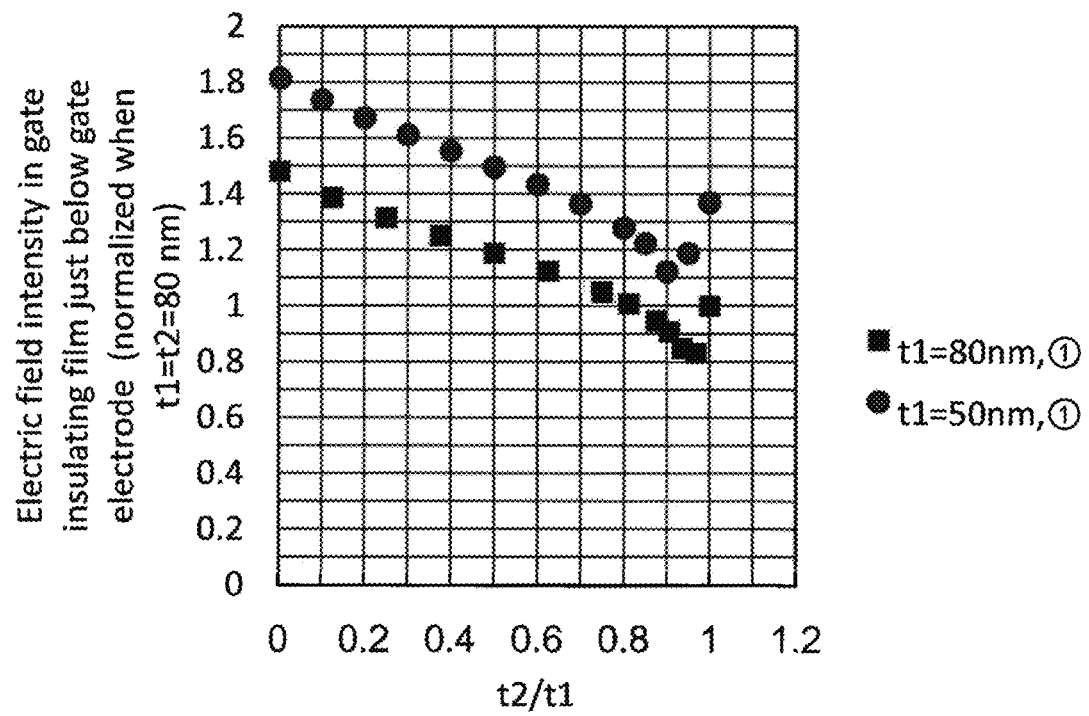
FIG. 15A is a graph showing the maximum electric field intensity, normalized by the electric field intensity when the gate insulating film has a constant thickness of 80 nm, when the thickness t1 of the gate electrode contact region is 80 nm or 50 nm and the ratio of the thickness t2 of the gate electrode non-contact region to the thickness t1 of the gate electrode contact region is varied.

FIG. 15A is a graph showing the maximum electric field intensity when the thickness t1 of the gate electrode contact region is 80 nm or 50 nm and the ratio t2/t1 of the thickness t2 of the gate electrode non-contact region to the thickness t1 of the gate electrode contact region is varied. The horizontal axis of FIG. 15A indicates the ratio of the thickness t2 to the thickness t1 (t2/t1). The vertical axis of FIG. 15A indicates the maximum electric field intensity in the gate insulating film.

As shown in FIG. 15A, when the ratio of the thickness t2 to the thickness t1 (t2/t1) is 0.8 or more and less than 1, preferably less than 0.98, the maximum electric field intensity in the gate insulating film is small. That is, in this case, the maximum electric field intensity in the gate insulating film is less than 1. That is, the maximum electric field intensity is smaller than that when the gate insulating film has a constant thickness (t1=t2). This tendency does not depend on the thickness t1 of the gate electrode contact region.

When the ratio of the thickness t2 to the thickness t1 (t2/t1) is 0.9 to 0.98, the maximum electric field intensity in the gate insulating film is smaller in both cases where the thickness t1 is 80 nm and 50 nm. It is desirable.

Also, in a case that the electric field is normalized by the maximum electric field intensity in the gate insulating film when the thickness t1 of the gate electrode contact region is 50 nm and the thickness t2 of the gate electrode non-contact region is 50 nm, the characteristics when t1 80 nm in FIGS. 14A and 15A are satisfied.

Figure 14B:
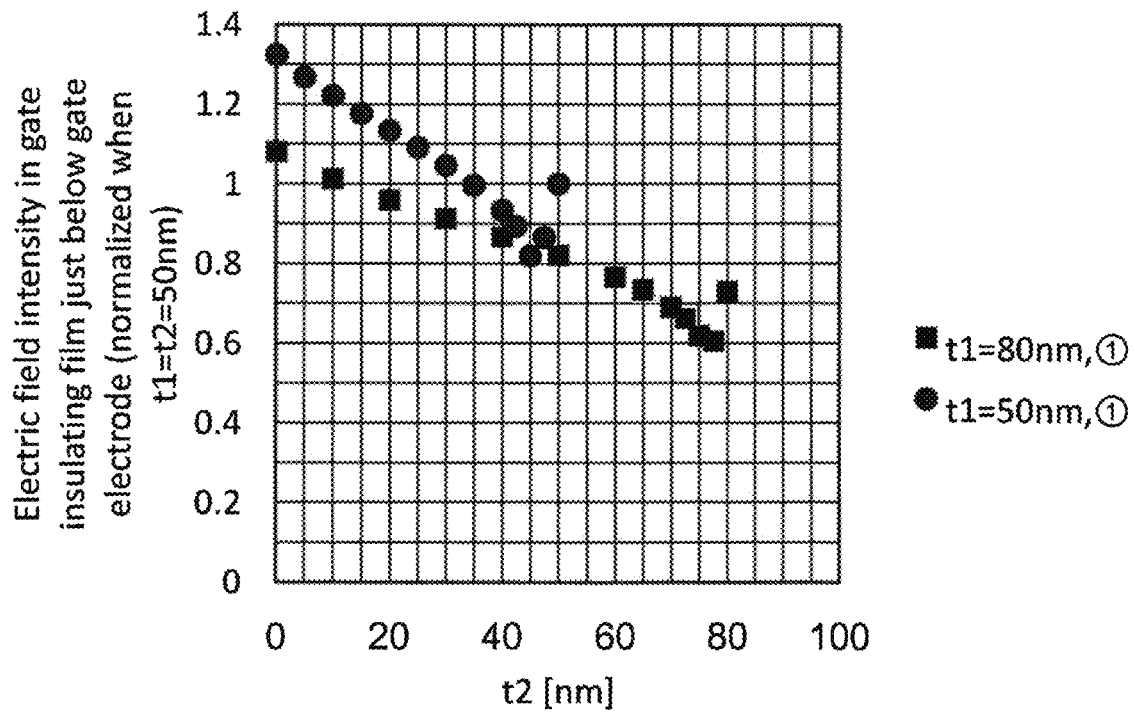
FIG. 14B is a graph showing the maximum electric field intensity, normalized by the electric field intensity when the gate insulating film has a constant thickness of 50 nm, when the thickness t1 of the gate electrode contact region is 80 nm or 50 nm and the thickness t2 of the gate electrode non-contact region is varied.
Figure 15B:
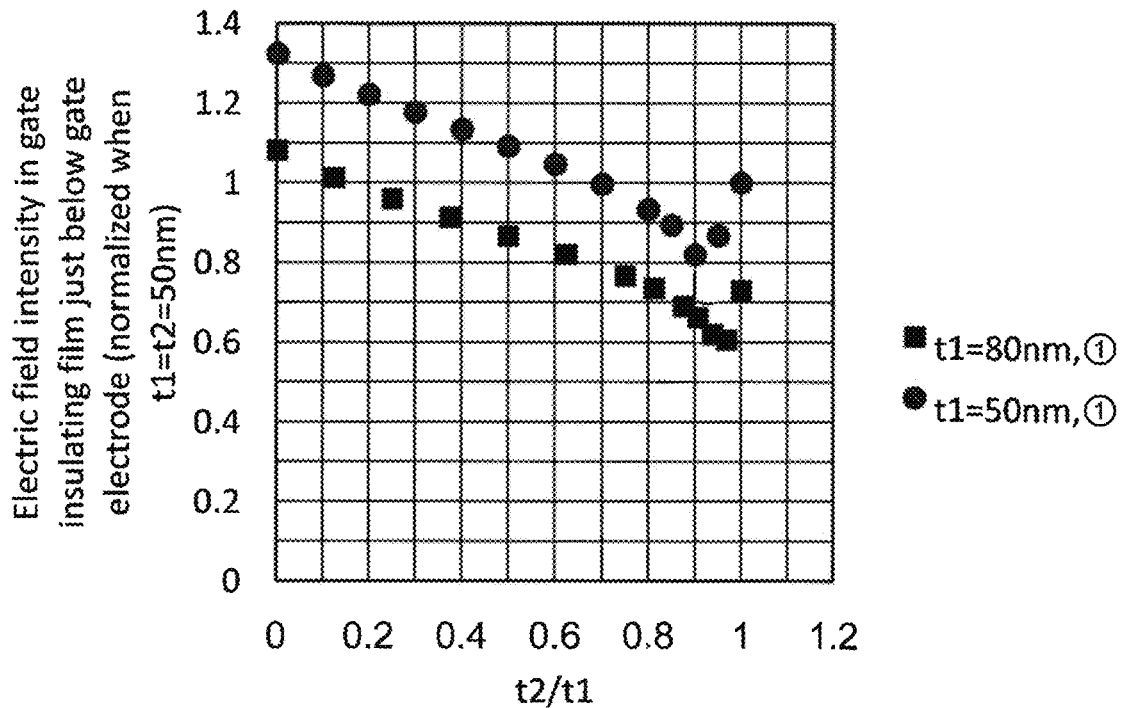
FIG. 15B is a graph showing the maximum electric field intensity, normalized by the electric field intensity when the gate insulating film has a constant thickness of 50 nm, when the thickness t1 of the gate electrode contact region is 80 nm or 50 nm and the ratio of the thickness t2 of the gate electrode non-contact region to the thickness t1 of the gate electrode contact region is varied.

FIG. 14B and FIG. 153 correspond to FIG. 14A and FIG. 15A, respectively. The vertical axes of FIGS. 14B and 15B are normalized by the maximum electric field intensity in the gate insulating film when the thickness t1 of the gate electrode contact region is 50 nm and the thickness t2 of the gate electrode non-contact region is 50 nm. FIG. 14B and FIG. 15B are different from FIG. 14A and FIG. 15A only in the thickness for the normalization of the electric field intensity.

As shown in FIG. 14B, the maximum electric field intensity in the gate insulating film is small in a region where the thickness t2 of the gate electrode non-contact region is 35 nm to 50 nm when t1=50 nm. That is, in this case, the maximum electric field intensity in the gate insulating film is smaller than 1.

As shown in FIG. 15B, when the ratio of the thickness t2 to the thickness t1 (t2/t1) is 0.7 or more and less than 1, preferably 0.8 or more and less than 1, more preferably less than 0.98, the maximum electric field intensity in the gate insulating film is small. That is, in this case, the maximum electric field intensity in the gate insulating film is less than 1. That is, the maximum electric field intensity is smaller than that when the gate insulating film has a constant thickness (t1=t2). This tendency does not depend on the thickness t1 of the gate electrode contact region.

When the ratio of the thickness t2 to the thickness t1 (t2/t1) is 0.9 to 0.98, the maximum electric field intensity in the gate insulating film is smaller in both cases where the thickness t1 is 80 nm and 50 nm. It is desirable.

From the above, it is found that the electric field intensity is smaller than the electric field intensity when no step is made, regardless of the values of t1 and t2 for normalizing the electric field intensity, when the ratio of the thickness t2 to the thickness t1 is within the following range. The ratio of the thickness t2 to the thickness t1 is preferably, 0.8≤(t2/t1) <1, more preferably, 0.8≤(t2/t1)<0.98, and further preferably, 0.9≤(t2/t1)<0.98.

In this way, simulation was performed for the structure in which $Al_2O_3$ is deposited on $SiO_2$. Otherwise, simulation may be performed for the structure in which SiN is deposited on $SiO_2$. Here, SiN has a dielectric constant $\varepsilon_2$ of 7.0. That is, the dielectric constant $\varepsilon_2$ of the passivation film is preferably higher than the dielectric constant $\varepsilon_1$=3.9 of the gate insulating film. Accordingly, $\varepsilon_2/\varepsilon_1$ is equal to 1.8. In this case, the electric field concentration is separated into the edge Q1 and the edge Q2 as shown in FIG. 10.

(Experiment)

1. Production of Semiconductor Device

Two types of semiconductor devices having the same deposition structure as that of the semiconductor device 100 according to the first embodiment were produced. The gate insulating film was made of $SiO_2$. The passivation film was made of $Al_2O_3$. However, the first semiconductor device satisfies the equation (1), but the second semiconductor device does not satisfy the equation (1).

In the first semiconductor device, the thickness t1 of the gate electrode contact region was 80 nm, and the thickness t2 of the gate electrode non-contact region was 70 nm. The ratio t2/t1 of the first semiconductor device was 0.875. In the second semiconductor device, the thickness t1 of the gate electrode contact region was 80 nm, and the thickness t2 of the gate electrode non-contact region was 50 nm. The ratio t2/t1 of the second semiconductor device was 0.625.

2. Experimental Results 2-1. First Semiconductor Device(Satisfying Equation (1))

Figure 16:
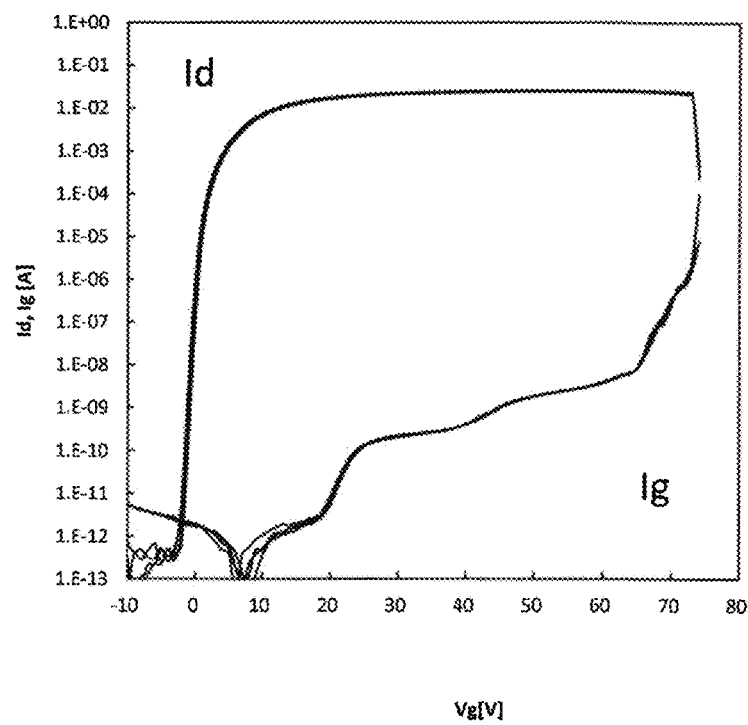
FIG. 16 is a graph (part 1) showing current characteristics in a semiconductor device in which the thickness t1 of the gate electrode contact region is 80 nm and the thickness t2 of the gate electrode non-contact region is 70 nm.

FIG. 16 is a graph (part 1) showing current characteristics in a semiconductor device in which the thickness t1 of the gate electrode contact region is 80 nm and the thickness t2 of the gate electrode non-contact region is 70 nm. The horizontal axis of FIG. 16 indicates gate voltage Vg(V). The vertical axis of FIG. 16 indicates drain current Id(A) or gate current Ig(A). Here, the drain current Id is a current flowing between the source electrode S1 and the drain electrode D1. The gate current Ig is a leakage current flowing between the source electrode S1 and the gate electrode G1.

Figure 17:
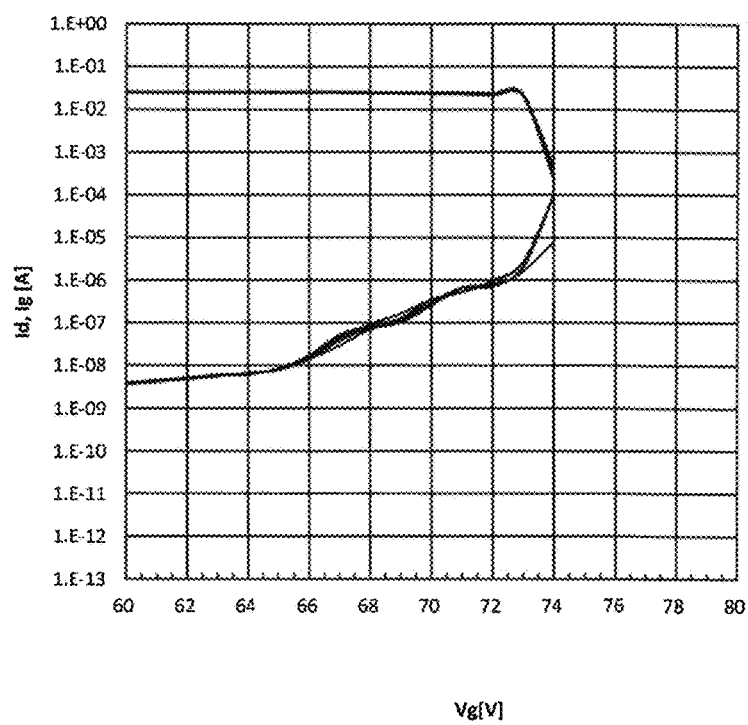
FIG. 17 is a graph (part 2) showing the current characteristics in a semiconductor device in which the thickness t1 of the gate electrode contact region is 80 nm and the thickness t2 of the gate electrode non-contact region is 70 nm.

FIG. 17 is an enlarged graph of a range where the gate voltage Vg(V) is 60 V to 80 V on the horizontal axis of FIG. 16.

As shown in FIGS. 16 and 17, the gate threshold voltage at which the drain current Id starts to flow is −1.0 V. The drain current Id is saturated after rising above the threshold voltage, and the drain current is sharply reduced at a certain voltage. On the other hand, the gate leakage current Ig is increased as the gate voltage Vg is increased, and is sharply increased when the gate voltage Vg exceeds the gate breakdown voltage, leading to a dielectric breakdown. The gate voltage Vg at which the drain current Id is sharply reduced is almost equal to the gate voltage Vg at which the gate current Ig is sharply increased. When the gate voltage is reduced due to gate breakdown, current does not flow through the channel, and the drain current is sharply reduced.

As shown in FIGS. 16 and. 17, when the gate voltage Vg is 73 V, the gate current Ig is sharply increased. At this time, the first semiconductor device is broken.

2-2. Second Semiconductor Device (Not Satisfying Equation (1))

Figure 18:
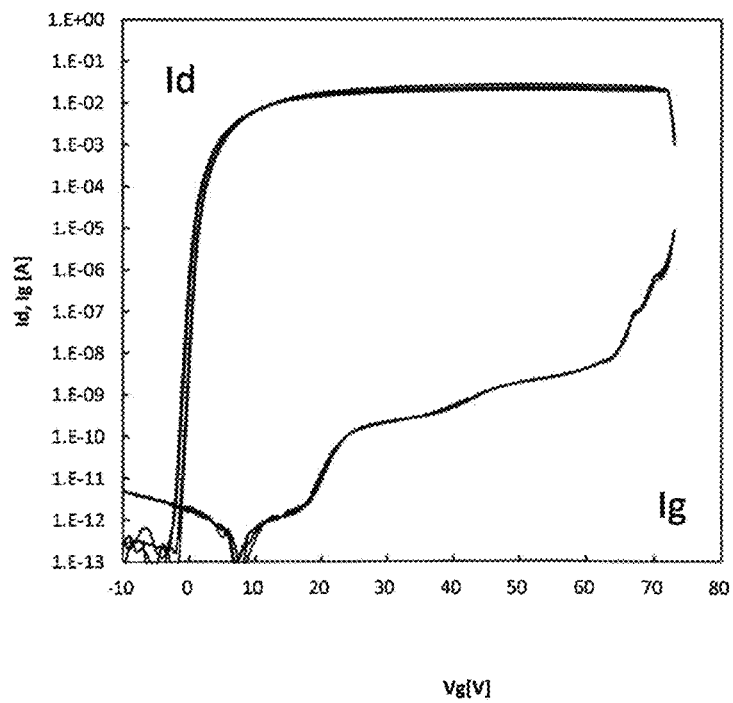
FIG. 18 is a graph (part 1) showing current characteristics in a semiconductor device in which the thickness t1 of the gate electrode contact region is 80 nm and the thickness t2 of the gate electrode non-contact region is 50 nm.

FIG. 18 is a graph (part 1) showing current characteristics in a semiconductor device in which the thickness t1 of the gate electrode contact region is 80 nm and the thickness t2 of the gate electrode non-contact region is 50 nm. The vertical and horizontal axes are the same as those of FIG. 16.

Figure 19:
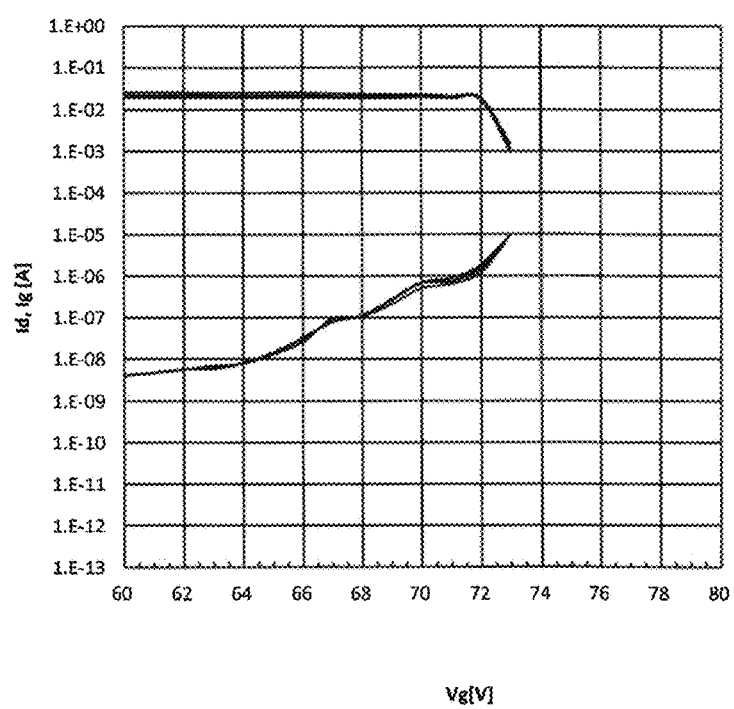
FIG. 19 is a graph (part 2) showing current characteristics in a semiconductor device in which the thickness t1 of the gate electrode contact region is 80 nm and the thickness t2 of the gate electrode non-contact region is 50 nm.

FIG. 19 is an enlarged graph of a range where the gate voltage Vg(V) is 60 V to 80 V on the horizontal axis of FIG. 18, as in FIG. 17.

As shown in FIGS. 18 and 19, the gate threshold voltage at which the drain current Id starts to flow is −0.5 V. The drain current Id is saturated after rising above the threshold voltage, and the drain current is sharply reduced at a certain voltage. On the other hand, the gate leakage current Ig is increased as the gate voltage Vg is increased, and is sharply increased at a certain voltage, leading to a dielectric breakdown. The gate voltage Vg at which the drain current Id is sharply reduced is equal to the gate voltage Vg at which the gate current Ig is sharply increased.

As shown in FIGS. 18 and 19, when the gate voltage Vg is 72 V, the gate current Ig is sharply increased. At this time, the second semiconductor device is broken.

3. Summary of Experiments

As shown in from FIGS. 16 to 19, when the thickness ratio (t2/t1) satisfies the equation (1), the breakdown voltage of the semiconductor device is slightly high.

What is claimed is:

1. A semiconductor device having a semiconductor layer, a gate insulating film on the semiconductor layer, a gate electrode on the gate insulating film, and a passivation film on the gate electrode, wherein the gate insulating film has a gate electrode contact region being in contact with the gate electrode, and a gate electrode non-contact region not being in contact with the gate electrode, the gate insulating film has a step at an interface between the gate electrode contact region and the gate electrode non-contact region, the passivation film has a dielectric constant higher than the dielectric constant of the gate insulating film, and a thickness of the gate electrode contact region and a thickness of the gate electrode non-contact region satisfy the following equation:

$$0.8 \leq t2/t1 < 1$$

t1: Thickness of gate electrode contact region,
t2: Thickness of gate electrode non-contact region.

2. The semiconductor device according to claim 1, wherein the gate electrode has a first side surface at an outer edge part thereof, the gate insulating film has a second side surface at the step, and the second side surface exists on an extension of the first side surface.

3. The semiconductor device according to claim 2, wherein the passivation film is in contact with the firs side surface of the gate electrode and the second side surface of the gate insulating film.

4. The semiconductor device according to claim 1, wherein the passivation film is not in contact with the gate electrode contact region of the gate insulating film, and is in contact with the gate electrode non-contact region of the gate insulating film.

5. The semiconductor device according to claim 2, wherein the second side surface is perpendicular to a top surface of the semiconductor layer.

6. A semiconductor device having a semiconductor layer, a gate insulating film on the semiconductor layer, a gate electrode on the gate insulating film and a passivation film on the gate electrode, wherein the gate insulating film has a gate electrode contact region being in contact with the gate electrode, and a gate electrode non-contact region not being in contact with the gate electrode, the thickness of the gate electrode non-contact region being constant and uniform in an entire area thereof, the passivation film has a dielectric constant higher than the dielectric constant of the gate insulating film, and a thickness of the gate electrode contact region and a thickness of the gate electrode non-contact region satisfy the following equation:

$$0.8 \leq t2/t1 < 1 \qquad (5)$$

t1: Thickness of gate electrode contact region,
t2: Thickness of gate electrode non-contact region.

* * * * *